United States Patent [19]

Kimura et al.

[11] Patent Number: 5,274,541
[45] Date of Patent: Dec. 28, 1993

[54] PARALLEL CIRCUIT MODULE INCLUDING A DIODE AND AN IGBT

[75] Inventors: Shin Kimura, Hitachi, Japan; Yasuo Matsuda, Eastchester, N.Y.; Norikazu Tokunaga; Mutsuhiro Mori, both of Hitachi, Japan; Toshiki Kurosu; Yutaka Suzuki, both of Hitachi, Japan; Naoki Sakurai; Yasumichi Yasuda, both of Hitachi, Japan; Tomoyuki Tanaka; Kenichi Onda, both of Hitachi, Japan

[73] Assignee: Hitachi, Ltd., Tokyo, Japan

[21] Appl. No.: 631,289

[22] Filed: Dec. 20, 1990

[30] Foreign Application Priority Data

Dec. 22, 1989 [JP] Japan .................. 1-331334

[51] Int. Cl.⁵ .................. H02H 7/122; H03K 17/687
[52] U.S. Cl. .................. 363/56; 363/132; 363/147; 307/584
[58] Field of Search .................. 307/570, 571, 584; 363/132, 147, 56, 58

[56] References Cited

U.S. PATENT DOCUMENTS

| 4,670,833 | 6/1987 | Sachs | 363/132 |
| 4,685,041 | 8/1987 | Bowman | 363/40 |
| 4,727,308 | 2/1988 | Huljak | 323/222 |
| 4,876,635 | 10/1989 | Park | 363/132 |

FOREIGN PATENT DOCUMENTS 59-35183  2/1977  Japan.

Primary Examiner—R. Skudy
Assistant Examiner—Adolf Berhane
Attorney, Agent, or Firm—Antonelli, Terry, Stout & Kraus

[57] ABSTRACT

In a module using a high-speed switching element such as an IGBT for a high-speed inverter, a matching condition is established between the switching characteristic of the IGBT and the recovery characteristic of the diode to be connected thereto in an anti-parallel fashion. As a result, the oscillating voltage appearing in the inverter circuit is suppressed to prevent erroneous operation of the inverter system.

1 Claim, 6 Drawing Sheets v : 100V/div
i : 200A/div
t : 0.1μs/div

RESULTS OF
CONVENTIONAL CASE v : 100V/div
i : 200A/div
t : 0.1μs/div

RESULTS OF THE
PRESENT INVENTION

PARALLEL CIRCUIT MODULE INCLUDING A DIODE AND AN IGBT

BACKGROUND OF THE INVENTION

The present invention relates to a parallel circuit including a diode and an insulated gate bipolar transistor (IGBT) as a high-speed switching element, to a module comprising an anti-parallel connection of an IGBT and a diode on a common base thereof, and to an inverter circuit using the module.

With expansion of the fields of application of power inverters, it has been essential to provide a small-sized inverter developing a high performance with a low noise. As a control element of the inverter, an IGBT having a high-speed switching characteristic of a power metal-oxide-semiconductor field-effect transistor (MOS-FET) and a high power characteristic of a bipolar transistor have been recently developed for practical application.

An IGBT has a fast turn-on time and a turn-off time ranging from 0.1 to 0.5 microseconds and hence is suitably driven into operation with a high frequency. In practical applications, the IGBT is connected to a diode in an anti-parallel fashion on a common base thereof. One to several such pairs are used to configure a module, which has been employed in a high-frequency inverter.

However, when such an IGBT is adopted to constitute an inverter system, a large voltage change or oscillation appears in a switching operation to cause a noise, which may possibly lead to a problem of an erroneous operation of the controller and/or a destruction of the IGBT.

A description will now be given of such an erroneous operation appearing when an inverter includes a module in which an IGBT and a diode are connected to each other in an anti-parallel (inverse-parallel) fashion. When a diode is recovered, an oscillating voltage is applied to an IGBT connected in parallel thereto. This causes an improper or erroneous driving circuit including the IGBT and hence a short circuit of the dc supply is formed to allow a large current to flow therethrough. In the vicinity of the critical range of the wrong operation, the oscillating voltage disappears due to the short circuiting of the inverter arm and hence the wrong operation is interrupted, thereby preventing the destruction of the IGBT in some cases. It has been found, however, that when the critical range is exceeded to cause the oscillating voltage, a large short circuit current of the dc supply flows to cause destruction of the IGBT.

As a method of preventing the erroneous operation described above, there have been known, for example, a method in which a gate signal to be supplied to the IGBT is made to gradually rise up to reduce the current change value di/dt at the turn-off time of the IGBT and a method in which the inverter is provided with a main control wiring with a lowered inductance to minimize the value di/dt at the turn-off time of the IGBT. These methods however disadvantageously lower the circuit operation speed, which is a problem that a high-speed circuit cannot be implemented. Namely, these methods are attended with a problem that the high-speed switching characteristic of the IGBT cannot be fully utilized.

SUMMARY OF THE INVENTION

It is therefore an object of the present invention to provide a parallel circuit of an IGBT and a diode in which the high-speed characteristic of the IGBT is highly developed.

Another object of the present invention is to provide a highly reliable inverter in which the voltage oscillation is suppressed to prevent operation malfunction.

In order to achieve the objects above, the cause leading to occurrence of the voltage oscillation or change have been examined. It has been accordingly determined that the voltage oscillation is caused as a result of a resonance associated with an energy accumulation in a wiring inductance L in the module and a parasitic capacitance C of the IGBT and the diode.

Consequently, in accordance with the present invention, as first means of suppressing the oscillating voltage, in order to absorb the energy of the inductance L of the wiring in the module, the parasitic capacitance of the IGBT and the diode is increased or a capacitor is connected to the circuit for this purpose.

Second means thereof is an adoption of a diode in which the peak-to-peak value $I_{RP}$ of the recovery current is reduced. The present inventors have determined that the recovery characteristic of the diode is required to be matched or cooperate with the turn-on characteristic of the IGBT. It has been found that the matching condition is to be determined depending on a recovery characteristic developed when the diode is recovered from the rated current $I_F$ with a maximum value of di/dt determined by a rise time in the turn-on operation of the IGBT. Assuming that the peak-to-peak value $I_{RP}$ does not exceed 0.55×Rated current $I_F$ and that the recovery time in which the recovery current is decreased from the peak-to-peak value $I_{RP}$ to one tenth thereof is $t_{rr}$, the module is to be configured with an IGBT and a diode having a recovery characteristic that $t_{rr}$ is not below $1.5 \times \pi \sqrt{LC}$.

Since the cause of the oscillating voltage is the resonance phenomenon related to the wiring inductance L of the module and the parasitic capacitance of the IGBT and the diode, the following relationships exist with respect to the energy accumulated by the peak-to-peak value $I_{RP}$ of the diode recovery current and the half period T of the resonance.

$$(\tfrac{1}{2})LI_{RP}^2 = (\tfrac{1}{2})CV^2 \qquad (1)$$

$$T = \pi \sqrt{LC} \qquad (2)$$

In consequence, by increasing the parasitic capacitance of the IGBT and the diode or by disposing a capacitor supplying the increase, the peak-to-peak value V of the voltage oscillation is lowered according to the expressions (1) and (2) and the oscillation period is elongated.

Furthermore, when the peak-to-peak value $I_{RP}$ of the diode recovery current is reduced like in the case of the second means, the absolute value of the energy stored in the module wiring inductance L is minimized and the peak-to-peak value V of the voltage oscillation is lowered. By adopting a diode having the recovery time $t_{rr}$ (in which the recovery current is decreased from the peak-to-peak value $I_{RP}$ to one tenth thereof) is set to be larger than the value T of the expression (2), a non-resonance state may be established. Alternatively, it is at least possible to rapidly attenuate the resonance operation.

As described above, in accordance with the present invention, a matching or cooperative state is arranged between the turn-on characteristic of the IGBT and the recovery characteristic of the diode so as to provide a module in which the voltage oscillation is minimized in the switching operation of the IGBT. Moreover, the modules are employed to configure an inverter in which the high-speed switching characteristic of the IGBT is highly developed and a high performance is attained with a high reliability.

BRIEF DESCRIPTION OF THE DRAWINGS

These and other objects and advantages of the present invention will become apparent by reference to the following description and accompanying drawings wherein.

DESCRIPTION OF THE PREFERRED EMBODIMENTS

Figure 1:
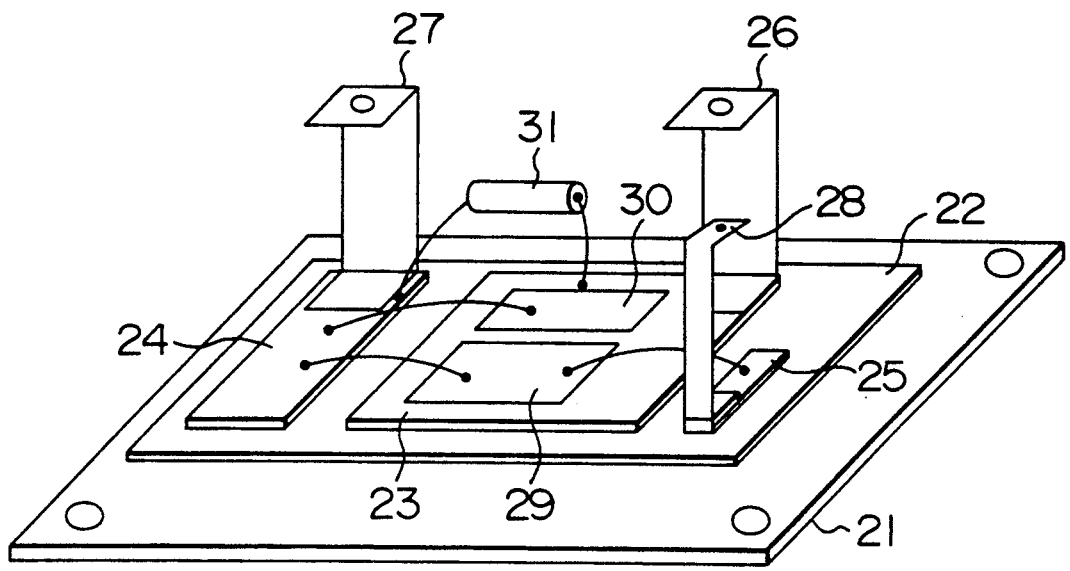
FIG. 1 is a perspective view showing the module configuration in an embodiment according to the present invention.

Referring now to the drawings, a description will be given of an embodiment according to the present invention.

FIG. 1 shows the configuration of a module according to the present invention. This module includes a base electrode plate 21, an insulator plate 22, a collector electrode plate 23, an emitter electrode plate 24, a gate electrode plate 25, a collector terminal 26, an emitter terminal 27, and a gate terminal 28. On the collector electrode plate 23, an IGBT 29 and a diode 30 are soldered to be electrically connected in an anti-parallel configuration to each other with respect to the electric characteristic. Moreover, the IGBT 29 has an emitter electrode and a gate electrode respectively linked with the emitter electrode plate 24 and the gate electrode plate 25 with wires. The diode 30 has an anode electrode connected to the emitter electrode plate 24 with a wire. Between the collector electrode plate 23 and the emitter electrode plate 24 is connected a capacitor 31. Although not shown here, these constituent elements are covered with a case excepting end portions of the respective terminals.

Next, a description will be given of, prior to the operation of the present invention, an example of the erroneous operation related to an occurrence of an oscillating voltage and a cause thereof.

Figure 8:
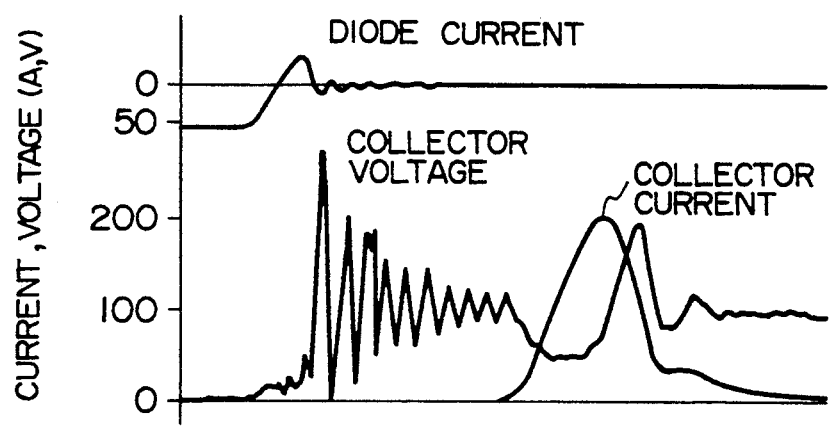
FIG. 8 is a graph showing an example of an improper or erroneous operation in a case of an inverter constituted with an IGBT and a diode connected to each other in an anti-parallel manner.

FIG. 8 shows an example of an improper or erroneous operation in an inverter constituted with a module including an anti-parallel connection of an IGBT and a diode. Details about the erroneous operation will be described later. In this graph, when a free foil diode is recovered, an oscillating voltage is applied to an IGBT connected in parallel thereto, which causes an erroneous operation of a circuit driving the IGBT and hence, causes a large, current to flow through an arm which is short circuited. In this example, at an occurrence of the arm short circuit, the oscillating voltage disappears and the erroneous operation is accordingly stopped, thereby preventing the destruction of the IGBT. However, this is because the phenomenon above of the disappearing of the oscillating voltage, has occurred at a limiting field of the erroneous operation i.e., at a time when the erroneous operation is limited. When there appears a further larger voltage oscillation, a large arm short circuit current flows to lead to a phenomenon of the IGBT destruction.

Figure 5:
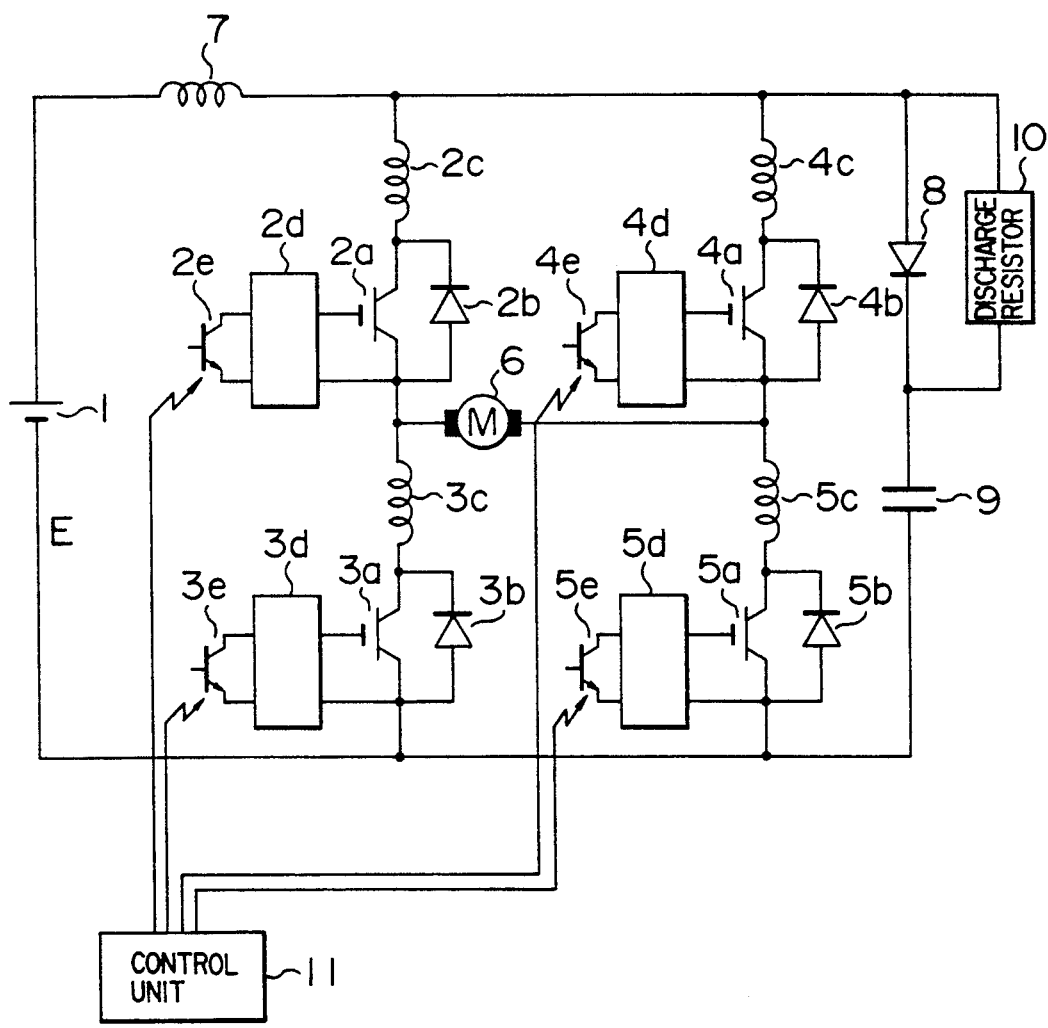
FIG. 5 is a circuit diagram showing a circuit example of an inverter.

FIG. 5 shows a circuit diagram of a typical inverter circuit including a direct-current source 1, IGBTs 2a, 3a, 4a, and 5a as switching elements, and a motor 6 as a load. The system further comprises freewheeling diodes 2b, 3b, 4b, and 5b to be respectively paired with the IGBTs 2a to 5a, which may be configured in the respective modules or may be totally formed in a module. Also disposed in the constitution are wiring inductances 2c, 3c, 4c, and 5c of the module and driver circuits 2d, 3d, 4d, and 5d related to the IGBTs 2a to 5a, respectively. The driver circuits 2d to 5d are connected to a control unit 11 via photocouplers 2e, 3e, 4e, and 5e, respectively.

A reference numeral 7 denotes an inductance of the main circuit wiring connecting the direct-current source 1 to the IGBTs 2a to 5a. The circuit system further includes a diode 8, a capacitor 9, and a discharge resistor 10, which form a clamping circuit to prevent an excessive voltage from being applied to the IGBTs 2a to 5a owing to the energy stored in the inductance 7 of the main circuit wiring.

In operation of the inverter system thus structured, for example, in a state in which the IGBTs 3a and 4a are on to flow a current to the load (M) 6, when the IGBT 3a is turned off, a current flowing through the load (M) 6 continues flowing, due to the energy of the load (M) 6, via the IGBT 4a and the freewheeling diode 2b. Thereafter, when the IGBT 3A is again turned on, a commutation occurs such that the load current flowing through the freewheeling diode 2b is changed to pass through the IGBT 3a.

' An abrupt oscillation voltage appearing in the inverter including an IGBT as a high-speed switching element has been found to take place at a recovery of the freewheeling diode in the commutation.

In this commutation of the load current, during a period from when the IGBT 3a is turned on to when the load current is commuted from the freewheeling diode 2b to the IGBT 3a (specifically, when the recovery current of the diode reaches the peak-to-peak value), only a voltage drop associated with the diode in the forward direction is applied across the terminals of the freewheeling diode 2b. In consequence, for the direct-current source 1, there appears a short circuit through the wiring inductances 7, 2c, and 3c and the IGBT 3a.

Figure 6:
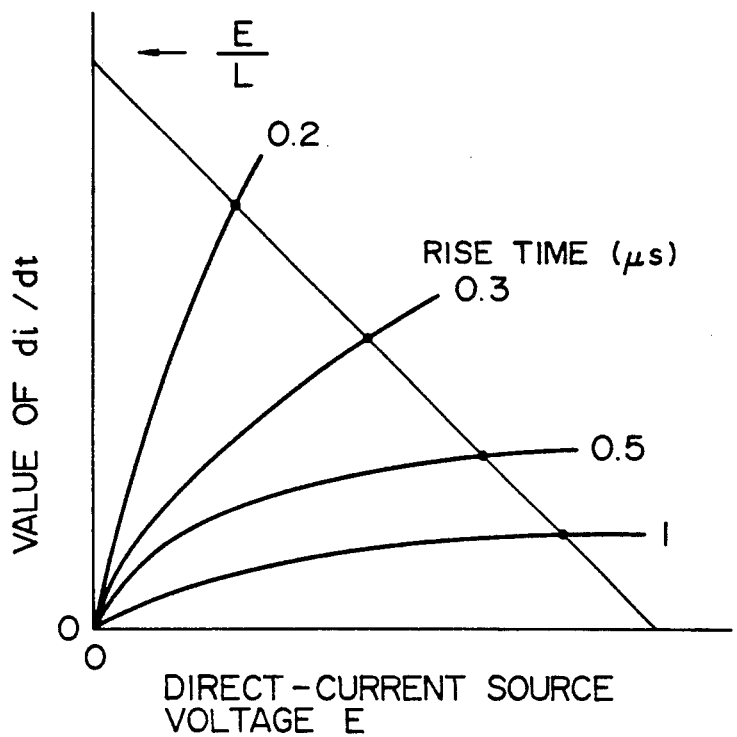
FIG. 6 and 7 are graphs respectively showing characteristics of a switching element and a diode.

FIG. 6 shows relationships between a direct-current source voltage E and the current change value di/dt a the turn-on time of switching elements having different turn-on characteristics. In this graph, a straight line drawn to be inversely proportional to the direct-current source voltage E stands for a load curve of a main circuit of the inverter. Intersections between the load curve and the characteristic curves of the switching elements denote the respective values of di/dt in the turn-on operation of the switching elements.

In a case of the conventional bipolar elements (classes 600 V-100 A or the like), the rise time in the turn-on operation is 0.5 microsecond to 3 microseconds, namely, the switching speed is relatively low. In consequence, the current change value di/dt at the turn-on time is suppressed by the element itself. However, in the case of the IGBT developing a short rise time ranging from 0.1 microsecond to 0.5 microsecond, with the direct-current source voltage E not being taken into consideration, the value di/dt is determined depending on the characteristic of the element and the wiring inductances (e.g. the inductances 2C, 3C, 7). When the rise time is much more reduced, there appears a large value of di/dt, which is determined only by the wiring inductance L.

The increased value of di/dt at the turn-on time of the IGBT means that the commutation of the current from the freewheeling diode 2b to the IGBT 3a is accomplished at a high speed in the inverter. Namely, the recovery of the freewheeling diode 2b is conducted with a large value of di/dt. As a result, the voltage to be applied to the freewheeling diode 2b oscillates in an abrupt fashion for the following reason.

Figure 7:
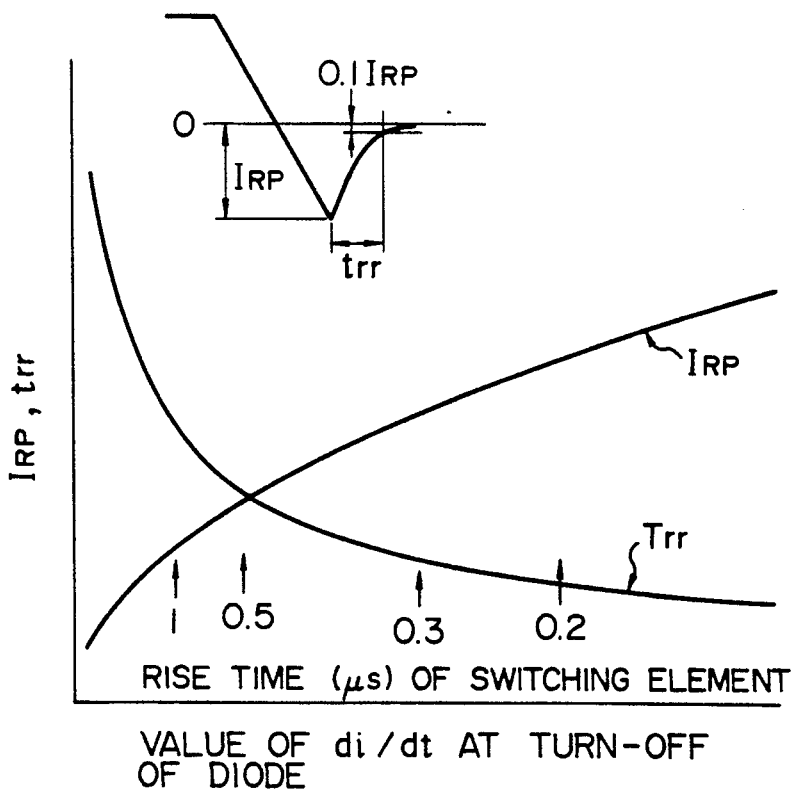

FIG. 7 shows relationships between the value di/dt at the turn-off time of the diode, the peak-to-peak value $I_{RP}$ of the recovery current, and the recovery time $t_{rr}$ in which the recovery current is reduced from the peak-to-peak value $I_{RP}$ to one tenth thereof. When the value di/dt at the recovery of the diode is increased, the peak-to-peak value $I_{RP}$ of the recovery current becomes greater and the recovery time $t_{rr}$ is reduced substantially in proportion to the increase in the value di/dt. In a recovery of the diode, that flow currents include one for discharging accumulated carriers and one charging a parasitic capacitance including a junction capacitance. However, for a large value of di/dt, a large recovery current flows for the discharge of the carriers, and the parasitic capacitance is charged with the peak-to-peak value $I_{RP}$, thereby minimizing the recovery time.

The increase in the peak-to-peak value $I_{RP}$ in the freewheeling diode of an inverter circuit means that the value of energy $\{(\frac{1}{2})LI_{RP}^2\}$ excessively stored in the wiring inductances (for example, the inductances 7 and 2c to 5c of FIG. 5) becomes greater. That is, as a result of the increase in the value di/dt at the turn-on time, assuming that there are employed diodes having the same recovery characteristic as the conventional bipolar element, the value of energy to be accumulated in the wiring inductances is proportional to a square of the peak-to-peak value $I_{RP}$. In consequence, the energy is considerably increased.

The energy stored in the wiring inductance 7 of the main circuit can be absorbed by the clamping circuit, for example, constituted with the diode 8, the capacitor 9, and the discharge resistor 10 of FIG. 5. However, the energy of the wiring inductance, for example, that is stored in the wiring inductance 2c is applied as an excessive voltage to the IGTB 2a and the freewheeling diode 2b.

In this situation, since a diode and an IGBT each have parasitic capacitance as described above, the energy accumulated in the wiring inductances of the module is transferred to the parasitic capacticance of the IGBT and the diode. If has not been established a matching condition therebetween, a resonance phenomenon of the inductance L and the capacitance may occur to cause the oscillating voltage. In the conventional module, the matching condition is not obtained and hence the oscillating voltage appears. The voltage oscillation results in a displacement current flowing via the driver circuits 2d to 5d to the control unit 11, which resultantly achieves a wrong operation.

Figure 2A:
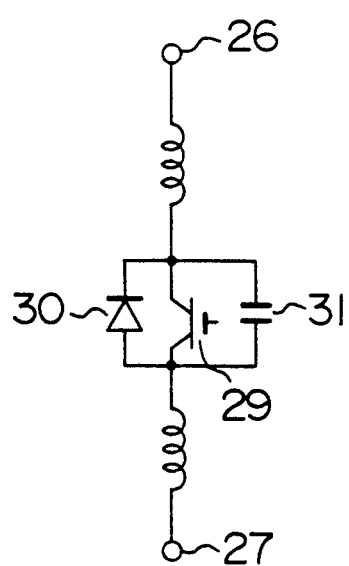
FIG. 2A is a circuit diagram of the module of FIG. 1.
Figure 2B:
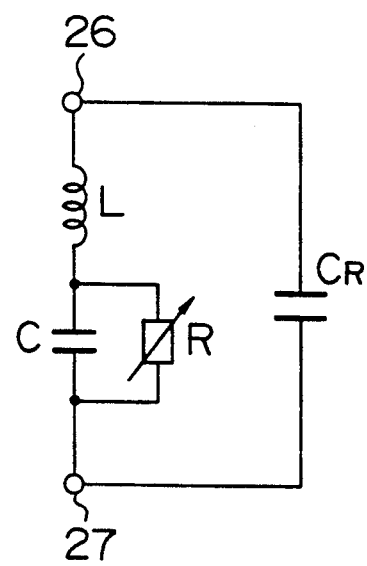
FIG. 2B is a circuit diagram useful to explain the principle of the present invention.

The present invention has been devised by paying attention to the phenomenon above so as to attain a matching condition between the characteristics in the module. For this purpose, the module of FIG. 1 is implemented in a circuit configuration of FIG. 2A. In this constitution, excepting the capacitor 31, an equivalent circuit in the recovery of the diode 30 can be represented as shown in FIG. 2B. The equivalent circuit of FIG. 2B is associated with an operation of the circuit after the recovery circuit of the diode reaches the peak-to-peak value $I_{RP}$. This circuit includes a wiring inductance L of the module, a total parasitic capacitance C of the IGBT and the diode, a variable resistance R associated with the discharge of remaining carriers, and a capacitor $C_R$ for a clamping circuit. As described above, in the recovery of the diode, there appear a current discharging stored carriers and a current flow charging the parasitic capacitance such as the junction capacitance. However, the carrier discharge operation still continues even when the recovery current reaches the peak-to-peak value $I_{RP}$ and hence the current continues flowing due to remaining carriers. In this equivalent circuit diagram, the current flow is represented by use of the variable resistor R.

A capacitor $C_R$ disposed between the terminals 26 and 27 of the module serves as a clamping circuit for absorbing the energy accumulated in the wiring inductance 7 of the primary circuit. Namely, the capacitor $C_R$ functions, in the same manner as the capacitor 9 of the clamping circuit of FIG. 5.

In the equivalent circuit, for simplicity of explanation, neglecting the resistor R and assuming a large capacitance to exist between the terminals 26 and 27 of the module, there are attained the relationships with respect to the energy stored by the peak-to-peak value $I_{RP}$ of the diode recovery current and the half period T of the resonance. These relationships are represented by the following expressions (1) and (2) as already described above.

$$(\tfrac{1}{2})LI_{RP}^2 = (\tfrac{1}{2})CV^2 \qquad (1)$$

$$T = \pi\sqrt{LC} \qquad (2)$$

In consequence, as can be seen from these expressions, when the parasitic capacitance C of the IGBT and the diode is increased or when a capacitor is disposed for the same purpose, the peak-to-peak value V of the oscillating voltage can be reduced and the oscillation period T is elongated.

The embodiment of FIG. 1 adopts a capacitor to lower the peak-to-peak value V of the oscillating voltage. According to the experiment results, the composite parasitic capacitance of the IGBT (100 A) and the diode is about 600 pF. Under this condition, when the capacitor 31 of 100 pF is connected thereto, the peak-to-peak value V of the oscillating voltage is considerably minimized. In this regard, when the capacitor 31 is thus connected to the IGBT, the switching loss is increased. However, the capacitance of the capacitor 31 need only be set to a small value of about twice the total parasitic capacitance of the IGBT and the diode, which hardly leads to any practical problem.

Next, a description will be given of the second means according to the present invention.

As can be seen from the equivalent circuit of FIG. 2B, the energy stored in the wiring inductance of the module is absorbed by the parasitic capacitance C of the IGBT and the diode and the resistance of the resistor R representing the remaining carriers. Consequently, if the peak-to-peak value $I_{RP}$ of the recovery current can be confined in a range where the energy is absorbed as above, the peak-to-peak value of the oscillating voltage and the voltage oscillation can also be suppressed.

Namely, representing a logically allowable peak-to-peak value of the oscillating voltage as V, the diode need only be selected to obtain the following relationship, which is derived from the expression (1).

$$I_{RP} < \sqrt{(CV^2)/L} \quad (3)$$

Furthermore, for the suppression of the resonance, the diode need only develop a recovery characteristic, namely, the recovery time $t_{rr}$ in which the recovery current is attenuated from the peak-to-peak value $I_{RP}$ to one tenth thereof is greater than the value of T of the expression (2) as follows. These conditions have been examined through calculations and expressions.

$$T > \pi\sqrt{LC} \quad (4)$$

Figure 3:
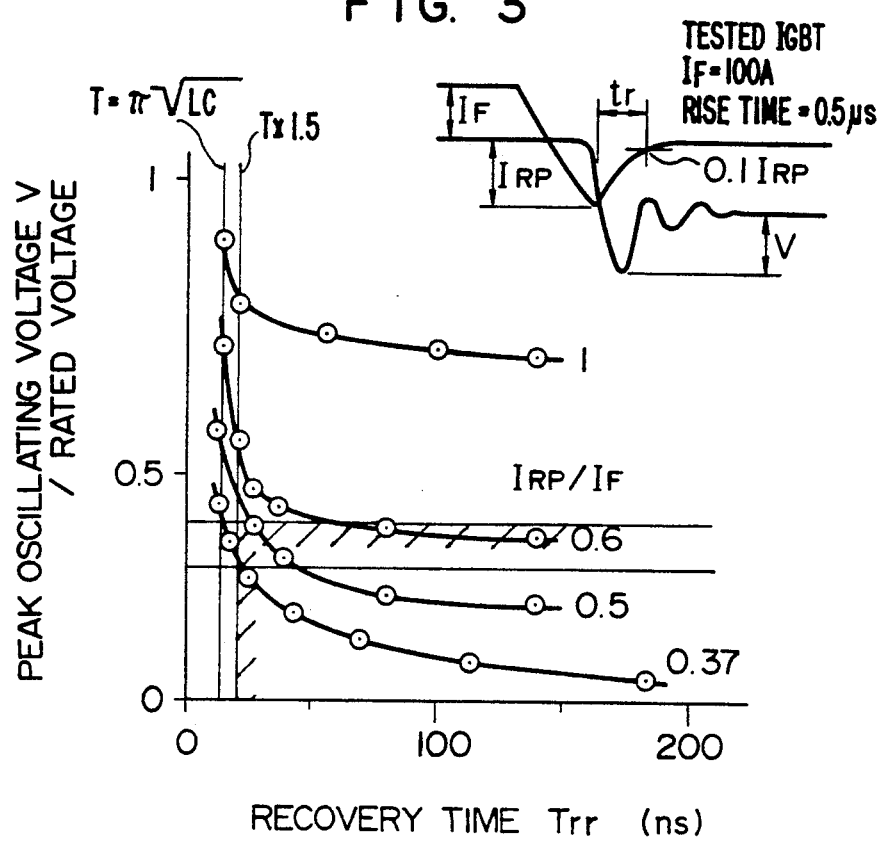
FIG. 3 is a graph associated with computed data.

FIG. 3 shows calculation results of relationships between the recovery time $t_{rr}$ and the peak-to-peak value V of the oscillating voltage of the oscillation. The peak-to-peak value $I_{RP}$ of the recovery current is employed as a parameter, which is normalized in this graph. As can be clear from the contours of graph curves, at a position where the recovery time $t_{rr}$ is equal to the resonance period $\pi\sqrt{LC}$ of the expression (2), peak-to-peak value V of the oscillating voltage takes a large value. However, when the recovery time $t_{rr}$ is equal to or more than $1.5\times\pi\sqrt{LC}$, the voltage value V is remarkably decreased.

Consequently, the recovery characteristic of the diode can be determined depending on the graph of FIG. 3 and the allowable peak-to-peak value of the oscillating voltage.

As can be understood from a fact that the characteristics of semiconductor devices listed in catalogs in the market are obtained with an experiment voltage set to be about half the rated voltage, the semiconductors are usually operated with a voltage not exceeding about half the rated voltage in many cases. This prevents the semiconductor elements from being applied with a voltage exceeding the rated voltage owing to the oscillating voltage appearing in the switching operation as above.

Consequently when the device is used with a power source voltage equal to half the rated voltage, the peak-to-peak value of the oscillating voltage may be increased up to half the rated voltage. However, according to the experiment results, the condition above is not satisfactory with respect to an erroneous operation of the driver circuit. Namely, when the peak-to-peak voltage is lowered to one third to one fourth of the rated voltage, satisfactory results are developed.

The recovery characteristic of the diode is thus determined depending on the graph of FIG. 3 and in consideration of the experiment results above such that the peak-to-peak value of the recovery current is at most $0.55\times$Rated current ($I_{RP}/I_F=0.55$) and the recovery time $t_{rr}$ is at least $1.5\times\pi\sqrt{LC}$.

In this connection, when the recovery characteristic of the diode is selected as above, the oscillating voltage may seem to increase when the current capacity of the IGBT module becomes greater for the following reason. Namely, in contrast to the parasitic capacitance C increasing in proportion to the current capacitance, the energy is accumulated in the wiring inductance of the module in proportion to a square of the peak-to-peak value $I_{RP}$. However, the peak of the oscillating voltage is saturated in this case, which has been confirmed in the experiment.

Figure 4:
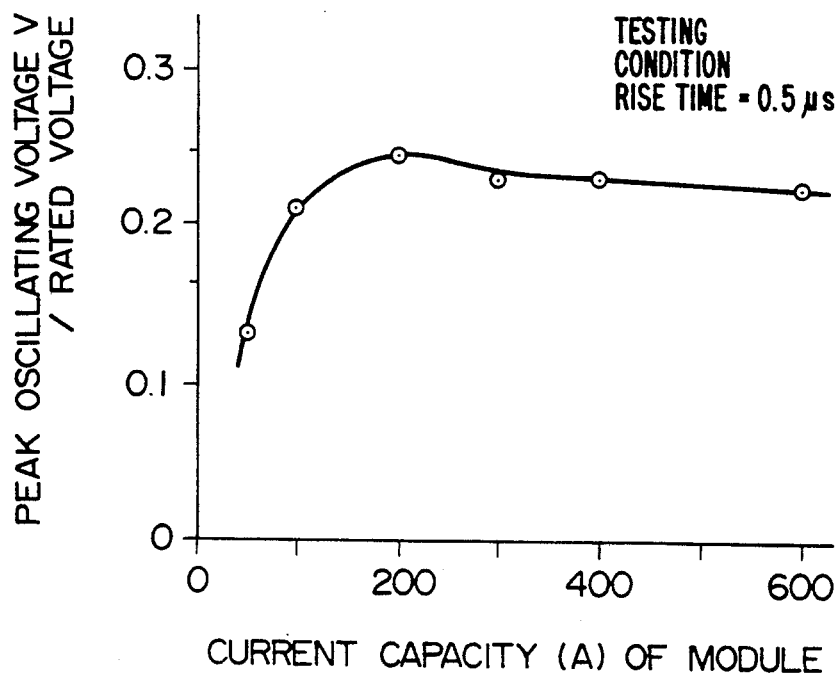
FIG. 4 is a graph associated with measured data.

FIG. 4 shows relationships between the current capacity of the IGBT module and the peak-to-peak value of the oscillating voltage. The current capacity is altered by changing the number of chips each including a parallel connection of an IGBT (50 A) and a diode. The wiring inductance of the module is 50 nH and the rise time at the turn-on time of the IGBT is 0.3 microsecond. As shown in the graph, when the current capacity exceeds a certain large value, the peak-to-peak value is saturated. This is because, like in the case of FIG. 6, that the value di/dt at the turn-on time is suppressed by, in addition to the device characteristic, the wiring inductance of the main circuit and hence the value di/dt is not increased in proportion to the increase of the current capacity of the module. Namely, as the current capacity becomes greater, it is more difficult to attain the highest turn-on speed as the characteristic of the IGBT. In consequence, even when the current capacity of the module is increased by using a diode having the identical recovery characteristic, the peak-to-peak value $I_{RP}$ of the recovery current does not increase in proportion to the increase of the current capacity, which hence leads to the saturation of the peak-to-peak value of the oscillating voltage.

Next, a description ill be specifically given of experiment conditions for selecting the diode.

As described in conjunction with the graph of FIG. 7, the recovery characteristic of the diode changes depending on the value di/dt at the recovery time. Consequently diode is to be selected in consideration of the maximum value of di/dt attained in association with the turn-on characteristic of an IGBT to be paired therewith. The experiment voltage employed to determine the value di/dt at the turn-on time of the IGBT is set to half the rated voltage, whereas the measurement is conducted at the room temperature. In this regard, when the temperature at the measurement time becomes higher, the peak-to-peak value of the recovery current is increased, however, the recovery time $t_{rr}$ is also elongated, which rather minimizes the voltage oscillation.

Moreover, in an IGBT module, chips of 50 A to 100 A are arranged in parallel to increase the current capacity. However, as described above, with an increase in the current capacity of the module, it is difficult to configure an experiments circuit which develops the maximum turn-on characteristic of the IGBT. In such a case, based on the rated current of each IGBT chip, the recovery characteristic of the diode is selected in the similar manner as described above.

In the description of the present invention above, the rise time at the turn-on time of the switching element is set to at most 0.5 microseconds. The concept of the present invention is also applicable to a case where the rise time of the switching element is 0.5 or more. However, when the rise time becomes to be longer, the value di/dt at the recovery of the freewheeling diode is decreased, and the peak-to-peak value $I_{RP}$ of the recovery current is reduced also when identical diodes are employed as shown in FIG. 8. As a result, the diode can be selected in a relatively easy manner and hence there does not appear so onerous a problem in the prior art.

There has been also used a high-speed element, like a MOS-FET device, which develops the rise time of about 0.1 microsecond at the turn-on time. However, when compared with the IGBT, the MOS-FET has a larger on-state resistance. Consequently, even for an identical current capacity, the chip area and the parasitic capacitance are increased as compared with the IGBT. Moreover, these modules have a relatively small current capacitance, namely, about 50 A at most. In consequence, as can be understood from the expression (1) and the graph of FIG. 4, there is developed a factor preventing the oscillating voltage from being remarkably increased. As a result, the diode can be selected in a relatively easy fashion.

However, when the rise time in the turn-on operation is at most 0.5 microsecond and the IGBTs can be used to form a module of a large current capacity, it is necessary to appropriately manufacture the diodes to be paired with the IGBTs.

As a result of discussions, for a diode to be paired with a switching element developing a relatively high rated voltage as described in conjunction with the embodiment, there has been heretofore employed a diode having a p-n junction. However, such a diode having a Schottky barrier and a p-n junction as described in the JP-A-59-35183 has a breakdown voltage ranging from 100 V to 200 V in many cases. In the experiments, it has been confirmed that a combination of a diode having a breakdown voltage not less than 600 V and the IGBT leads to a considerably efficient result.

Figure 10:
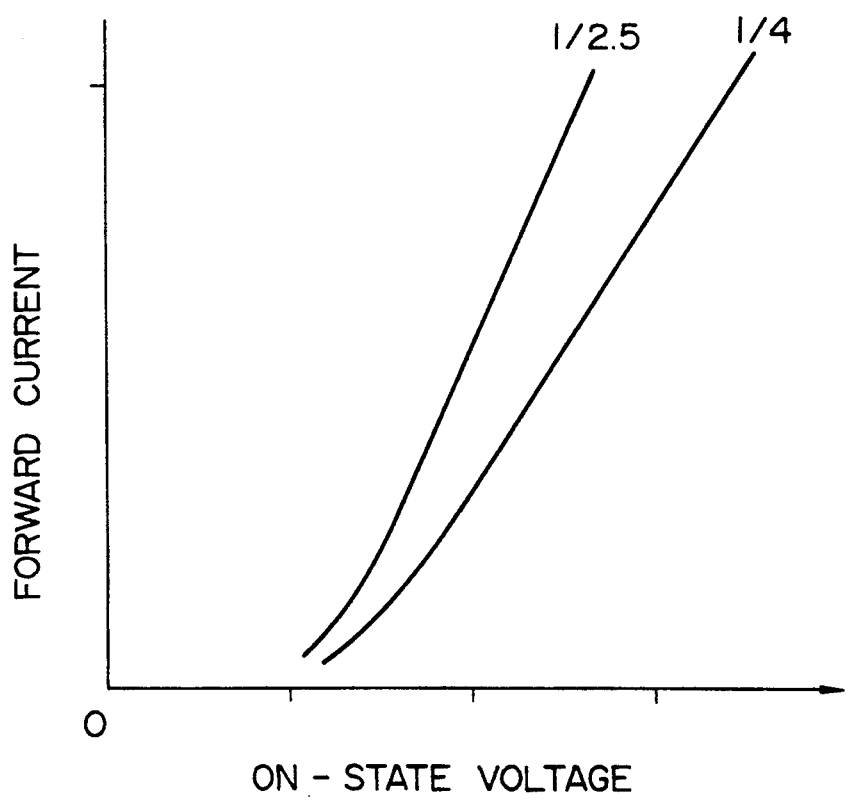
FIG. 10 is a graph showing relationships between an on-state voltage and a forward current developed in a diode associated with a switching element when a chip area of the diode is changed with respect to the switching element.

Furthermore, as a method of minimizing the peak-to-peak value $I_{RP}$ of the recovery current of the diode, an impurity doping and/or an electron beam irradiation may be used to reduce the life time of carriers. This method may also be used to produce a diode materializing the present invention. However, this method is attended with a disadvantage that the module loss is increased. In order to remove the disadvantageous feature, as can be seen from the relationships between the on-state voltage and the forward current of the diode with respect to differences in the chip area (FIG. 10), it has been found to be effective that the chip area of the diode, which is conventionally ⅓ to ¼ of the area of IGBT, is increased up to about 1/2.5 of the IGBT area. In addition, it has been known that when the chip area of the diode is increased with respect to the IGBT area, the thermal resistance is decreased in a reverse proportion to the increase. In this regard, according to the provision above, the temperature increase due to the loss can be minimized.

Furthermore, when an IGBT is paired with a diode having a higher breakdown voltage as compared with the IGBT, the recovery time $t_{rr}$ is elongated and the voltage oscillation is efficiently suppressed. The breakdown voltage of the element substantially depends on a base layer thereof. Even when the thickness of the base layer of the diode is set to be 1.2 times that of the base layer of the IGBT, the voltage oscillation is decreased substantially in a reverse proportion thereto.

Figure 9A:
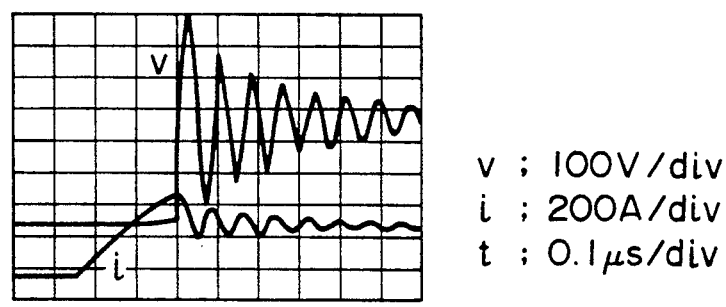
FIG. 9A is a graph showing characteristics of a conventional example.
Figure 9B:
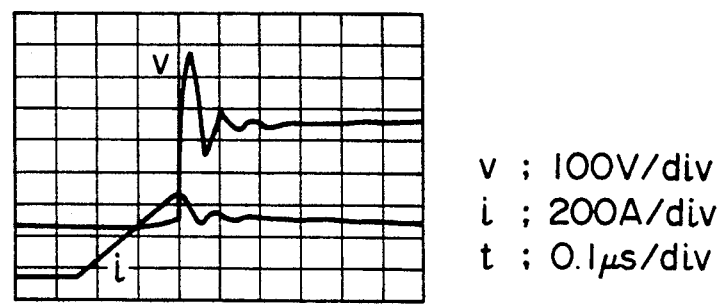
FIG. 9B is a graph showing an example of advantages attained in accordance with the present invention.

FIG. 9B shows a graph of voltage and current waveform examples developed when a diode is recovered in an inverter including an IGBT module according to the present invention. FIG. 9A shows a graph of voltage and current waveform examples obtained from a conventional system. In the module of the present invention, the peak-to-peak value of the oscillating voltage and the voltage oscillation are considerably decreased.

In an inverter including the module according to the present invention, even when the IGBT is operated at a high speed, the ascending voltage and the voltage oscillation are suppressed and an erroneous operation of the IGBT driver circuit conventionally caused by a noise, is prevented. Moreover, there is implemented a highly reliable (low-noise) inverter developing a high performance with an increased efficiency (high switching speed).

As many apparently widely different embodiments of the present invention can be made without departing from the spirit and scope thereof, it is to be understood that the invention is not limited to the specific embodiments thereof except as defined in the appended claims.

We claim:

1. A module having a semiconductor substrate for providing thereon an insulated gate bipolar transistor (IBGT) and a diode, said IGBT and said diode being electrically connected in an anti-parallel fashion in said module, wherein assuming a value of di/dt attained, for a turn-on rise time of 0.5 μs of the said IGBT with a voltage equal to half a rated voltage thereof and at room temperature of said semiconductor substrate, is α max, where i represents the current through said IGBT and α max represents the maximum value of di/dt the recovery characteristic of said diode, in the parallel connection, is such that a peak-to-peak value ($I_{RP}$) of a recovery current thereof is less than 0.55 times the rated current ($I_F$) when said diode is recovered at the rated current $I_F$ to the value of di/dt corresponding to α max, and a recovery time thereof, in which the recovery current is attenuated from the peak-to-peak value $I_{RP}$ to one tenth thereof, is at least 0.75 times a resonance period determined by the sum of parasitic capacitances associated with said IGBT and said diode and a wiring inductance existing in said module.

* * * * *